United States Patent
Ren et al.

(10) Patent No.: US 12,494,391 B2
(45) Date of Patent: Dec. 9, 2025

(54) SEMICONDUCTOR PROCESSING APPARATUS

(71) Applicant: BEIJING NAURA MICROELECTRONICS EQUIPMENT CO., LTD., Beijing (CN)

(72) Inventors: Xiaoyan Ren, Beijing (CN); Yongfei Wang, Beijing (CN); Xiaoping Shi, Beijing (CN); Yunfeng Lan, Beijing (CN); Haifeng Qin, Beijing (CN); Wenqiang Zhang, Beijing (CN); Hao Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 287 days.

(21) Appl. No.: 18/254,049

(22) PCT Filed: Nov. 17, 2021

(86) PCT No.: PCT/CN2021/131149
§ 371 (c)(1),
(2) Date: May 23, 2023

(87) PCT Pub. No.: WO2022/111354
PCT Pub. Date: Jun. 2, 2022

(65) Prior Publication Data
US 2023/0411188 A1    Dec. 21, 2023

(30) Foreign Application Priority Data
Nov. 25, 2020 (CN) .......................... 202011340051.0

(51) Int. Cl.
*H01L 21/67* (2006.01)
*H01L 21/677* (2006.01)
*H01L 21/687* (2006.01)

(52) U.S. Cl.
CPC .. *H01L 21/67253* (2013.01); *H01L 21/67742* (2013.01); *H01L 21/68714* (2013.01)

(58) Field of Classification Search
CPC ......... H01L 21/67253; H01L 21/67742; H01L 21/68714; H01L 21/6719; H01L 21/68742;
(Continued)

(56) References Cited

U.S. PATENT DOCUMENTS 6,096,135 A * 8/2000 Guo .................. H01L 21/67109
                                                118/728
6,403,491 B1 * 6/2002 Liu .................... H01L 21/76802
                                                257/E21.507
(Continued)

FOREIGN PATENT DOCUMENTS

CN       1317147 A      10/2001
CN     102766902 A      11/2012
(Continued)

OTHER PUBLICATIONS

The World Intellectual Property Organization (WIPO) International Search Report for PCT/CN2021/131149 Feb. 10, 2022 7 Pages (including translation).

*Primary Examiner* — Mohammed Shamsuzzaman
(74) *Attorney, Agent, or Firm* — ANOVA LAW GROUP, PLLC

(57) ABSTRACT

A semiconductor processing apparatus includes a process chamber, a gas intake device, a base, and a flow guide structure. The process chamber includes a process area and a transfer area arranged from top to bottom, the gas intake device is disposed at a top of the process chamber for
(Continued)

introducing a process gas into the process area. The base is vertically movable and is disposed in the transfer area for carrying a wafer. The flow guide structure is connected to a gas supply source, and fixedly attached to the base; and when the base is located at a process position, the flow guide structure is configured to blow a gas outward to an outer peripheral surface. An exhaust structure is disposed at the sidewall of the process chamber and is configured to discharge the gas blown out of the flow guide structure when the base is located at the process position.

20 Claims, 5 Drawing Sheets

(58) Field of Classification Search
CPC ............ C23C 16/4401; C23C 16/4412; C23C 16/45519; C23C 16/45544; C23C 16/45591; C23C 16/4586; C23C 16/4585; C23C 16/45561; C23C 16/4581; C23C 16/54

See application file for complete search history.

(56) References Cited

U.S. PATENT DOCUMENTS

| | | | |
|---|---|---|---|
| 9,870,964 B1* | 1/2018 | Yoshino | H01L 21/0228 |
| 9,957,601 B2* | 5/2018 | Rasheed | C23C 14/0063 |
| 2008/0078326 A1* | 4/2008 | Sung | H01L 21/67069 |
| | | | 118/723 R |
| 2012/0322270 A1* | 12/2012 | Long | H01J 37/32651 |
| | | | 156/345.35 |
| 2014/0182631 A1* | 7/2014 | Namba | H01L 21/67051 |
| | | | 15/268 |
| 2015/0279663 A1* | 10/2015 | Harada | C23C 16/34 |
| | | | 438/785 |
| 2016/0379848 A1* | 12/2016 | Yanagisawa | H01L 21/3065 |
| | | | 156/345.26 |
| 2017/0330769 A1* | 11/2017 | She | C23C 16/0245 |
| 2017/0345617 A1* | 11/2017 | Takeda | H01J 37/3244 |
| 2021/0142989 A1* | 5/2021 | Iizuka | H01L 21/3065 |

FOREIGN PATENT DOCUMENTS

| | | | | |
|---|---|---|---|---|
| CN | 104342637 A | | 2/2015 | |
| CN | 105695936 A | | 6/2016 | |
| CN | 105981135 A | | 9/2016 | |
| CN | 109811406 A | | 5/2019 | |
| CN | 110592553 A | | 12/2019 | |
| CN | 111364021 A | | 7/2020 | |
| CN | 111952233 A | | 11/2020 | |
| CN | 112593208 A | | 4/2021 | |
| EP | 4253596 A1 | | 10/2023 | |
| JP | 2009536461 A | * | 10/2009 | ......... H01L 21/6831 |
| JP | 2012186248 A | | 9/2012 | |
| JP | 2013084552 A | * | 5/2013 | ........ H01J 37/32422 |
| JP | 2019220509 A | * | 12/2019 | ....... H01L 21/67017 |
| JP | 2020105555 A | * | 7/2020 | ............. C23C 16/16 |
| KR | 20080069125 A | * | 7/2008 | ......... H01L 21/6875 |
| KR | 20100027040 A | * | 3/2010 | ........ C23C 16/45508 |
| KR | 20100068199 A | * | 6/2010 | ......... C23C 16/4412 |
| KR | 101387518 B1 | * | 5/2014 | ....... C23C 16/45591 |
| KR | 101399904 B1 | * | 5/2014 | ....... C23C 16/45591 |
| KR | 101501802 B1 | * | 3/2015 | ............ H01L 21/205 |
| KR | 101602016 B1 | * | 3/2016 | ....... H01L 21/02233 |
| WO | WO-0005751 A1 | * | 2/2000 | ............. H01L 21/68 |
| WO | WO-2016082753 A1 | * | 6/2016 | ........ H01J 37/32798 |

\* cited by examiner

SEMICONDUCTOR PROCESSING APPARATUS

CROSS-REFERENCE TO RELATED APPLICATIONS

This application is a national phase entry of PCT Patent Application No. PCT/CN2021/131149, filed on Nov. 17, 2021, which claims the priority of Chinese Patent Application No. 202011340051.0, filed on Nov. 25, 2020, the entire contents of all of which are incorporated herein by reference.

TECHNICAL FIELD

The present disclosure relates to the technical field of semiconductor processing technologies and, more particularly, to a semiconductor processing apparatus.

BACKGROUND

As the integrated circuit technology currently advances in the direction of miniaturization, integration, and high performance, a semiconductor processing apparatus using atomic layer deposition (hereinafter referred to as ALD) technology has widely adopted due to various advantages such as a highly controllable film thickness, excellent uniformity, and high step coverage, and has replaced conventional chemical vapor deposition (hereinafter referred to as CVD) technology in some fields. The ALD technology has a layer-by-layer saturated self-adsorption characteristics. A substance can be coated layer-by-layer on a surface of a substrate in a form of a monoatomic film to form an ultra-thin film with a controllable thickness.

For an ALD processing apparatus, it is important to quickly purge one reaction precursor from a process chamber and pass another reaction precursor to the process chamber to avoid any CVD reaction between the two reaction precursors. This is an important issue that has to be considered for the ALD processing apparatus in mass production. On one hand, mixing of the two reaction precursors may lead to uncontrollable growth rate of the monoatomic film, and on the other hand, particles may be formed after the two reaction precursors are mixed and reacted with each other. In the conventional ALD technology, the reaction precursor is often removed by extending a purging time. However, extending the purging time reduces productivity of semiconductor processing apparatus.

To solve the above-described problem, one solution is to divide the process chamber into a process area and a transfer area by adding a partition plate, and to pass an inert gas into the transfer area to prevent the process gas in the process area from entering the transfer area and causing particle pollution. Since there may be a gap between the partition plate and a base, this solution may not completely prevent the process gas from diffusing to the transfer area, and it still needs to take a long time for purging to remove the reaction precursor. Another solution is to add a protrusion structure on the base, and to form a closed contact between the protrusion structure and the partition plate through seals such as bellows, soft materials, and sealing rings to achieve a complete physical isolation of the process area and the transfer area. Thus, the process gas is completely prevented from diffusing to the transfer area, the purging time for the process gas is effectively reduced. However, due to physical isolation methods used in this solution, particles and reactive gases are likely to be hidden in a sealing part, thereby causing particle pollution to the process chamber. Because the sealing part needs frequent movement and contact, other accompanying pollution and lifespan of the sealing part may become an issue. In addition, because the sealing part may only be used in a low temperature range (for example, around 200° C. and below), it may not meet certain high-temperature process requirements.

SUMMARY

In view of the shortcomings of the existing methods, the present disclosure proposes a semiconductor processing apparatus to solve the technical problems of the prior art that the process chamber has low productivity due to the long purging time, and the sealing parts have low service life and low applicability.

One aspect of the present disclosure provides a semiconductor processing apparatus. The semiconductor processing apparatus includes a process chamber, a gas intake device, a base, and a flow guide structure. The process chamber includes a process area and a transfer area arranged from top to bottom. The gas intake device is disposed at a top of the process chamber for introducing a process gas into the process area. The base is vertically movable and is disposed in the transfer area for carrying a wafer. The flow guide structure is connected to a gas supply source, and is fixedly attached to the base; when the base is located at a process position, the flow guide structure is configured to blow a gas outward to an outer peripheral surface, such that a gas wall is formed between the outer peripheral surface of the base and an inner peripheral surface of a sidewall of the process chamber to prevent the process gas in the process area from entering the transfer area. An exhaust structure is disposed at the sidewall of the process chamber and is configured to discharge the gas blown out of the flow guide structure when the base is located at the process position.

In some embodiments, the flow guide structure includes a flow guide slot and a flow channel arranged in the base, the flow guide slot is annular-shaped, and extends along a circumferential direction of the base, and the flow guide slot includes an opening disposed on the outer peripheral surface of the base; and two ends of the flow channel are connected to the flow guide slot and the gas source supply, respectively, and the flow channel is used to guide the gas from the gas source supply to the flow guide slot.

In some embodiments, the base includes a base body and a support shaft, the base body is used to carry the wafer, an outer peripheral surface of the base body is the outer peripheral surface of the base; and one end of the support shaft is connected to the base body, and other end passes through a bottom wall of the process chamber to connect with a driving source, driven by the driving source, to drive the base body to ascend or descend; and the flow channel includes a horizontal section disposed in the base body and a vertical section that extends vertically downward to sequentially pass through the base body and the support shaft, an outlet end of the horizontal section is connected to the flow guide slot, and an inlet end of the vertical section is connected to the gas source supply.

In some embodiments, the flow channel includes a plurality of flow channels, horizontal sections of the plurality of flow channels are uniformly arranged along a circumferential direction of the base body, the horizontal section of each of the plurality of flow channels extends along a radial direction of the base body, and vertical sections of the plurality of flow channels are uniformly arranged around an axis of the support shaft.

In some embodiments, the flow guide structure further includes a pressurization chamber disposed in the base, the pressurization chamber is annular-shaped, the pressurization chamber is arranged around an axis of the base, the pressurization chamber is connected between an outlet end of the flow channel and the flow guide slot for increasing a pressure of gas discharged from the pressurization chamber.

In some embodiments, the exhaust structure includes an exhaust port, an exhaust cavity, and a first exhaust channel that are disposed in the sidewall of the process chamber, the exhaust port is annular-shaped and extends along a circumferential direction of the sidewall of the process chamber, an inlet end of the exhaust port is located on the inner peripheral surface of the sidewall of the process chamber, and when the base is at the process position, the inlet end is opposite to the opening of the flow guide slot; and the exhaust cavity is annular-shaped and extends along the circumferential direction of the sidewall of the process chamber, the exhaust cavity is connected to an outlet end of the exhaust port and an inlet end of the first exhaust channel respectively, and an outlet end of the first exhaust channel is connected to a first gas extraction device.

In some embodiments, the semiconductor processing apparatus further includes a second exhaust channel disposed on the sidewall or the bottom wall of the process chamber, and two ends of the second exhaust channel are connected to the transfer area and the first gas extraction device respectively.

In some embodiments, the semiconductor processing apparatus further includes a process exhaust structure, the process exhaust structure is connected to the process area and is configured to discharge the process gas in the process area.

In some embodiments, the process exhaust structure includes an exhaust slot, an exhaust grid, and a third exhaust channel disposed in the sidewall of the process chamber, the exhaust slot is annular-shaped and extends along the circumference of the sidewall of the process chamber, and an opening of the exhaust slot is located on the inner peripheral surface of the sidewall of the process chamber; the exhaust grid is ring-shaped, and surrounds the opening of the exhaust slot; and an inlet end of the third exhaust channel is connected to the exhaust slot, and an outlet end of the third exhaust channel is connected to a second gas extraction device.

In some embodiments, a partition plate is configured in the process chamber, the partition plate is ring-shaped and extends along the circumferential direction of the sidewall of the process chamber, an outer periphery of the partition plate is connected to the inner peripheral surface of the process chamber, and when the base is located at the process position, an upper surface of the partition plate is coplanar with an upper surface of the base.

The embodiments of the present disclosure provide at least the following beneficial effects. The semiconductor processing apparatus provided in the embodiments of the present disclosure utilizes the guide structure fixedly arranged with the base. When the base is located at the process position, the gas is blown to the outside of the outer peripheral surface of the base to form the gas wall between the outer peripheral surface of the base and the inner peripheral surface of the sidewall of the process chamber to achieve complete isolation between the process area and the transfer area. At the same time, the exhaust structure is used to discharge the gas blown out of the guide structure, such that the process gas can be discharged with the gas flow, such that the process gas in the process area is prevented from entering the transfer area, and the contamination of the transfer area by the particles formed by the process gas can be avoided. As such, the purging time of the process chamber can be substantially shortened and the productivity of the semiconductor processing apparatus can be improved. In addition, the embodiments of the present disclosure utilize the gas wall to prevent the process gas from entering the transfer area, eliminates the need to install sealing parts, and causes no other pollution due to long-term operation, so there are no problems such as loss and damage of sealing parts, and inapplicability to high temperature conditions. Therefore, the gas wall has wide applicability and scope of application, and also saves maintenance time due to damage to the sealing parts, thereby reducing maintenance costs and increasing equipment productivity.

Additional aspects and advantages of the present disclosure will be set forth in part in the description which follows, and will become apparent from the description, or may be learned by practice of the present disclosure.

BRIEF DESCRIPTION OF THE DRAWINGS

The above and/or additional aspects and advantages of the present disclosure will become apparent and easy to understand from the following description of the embodiments in conjunction with the accompanying drawings.

DETAILED DESCRIPTION OF THE EMBODIMENTS

Figure 1:
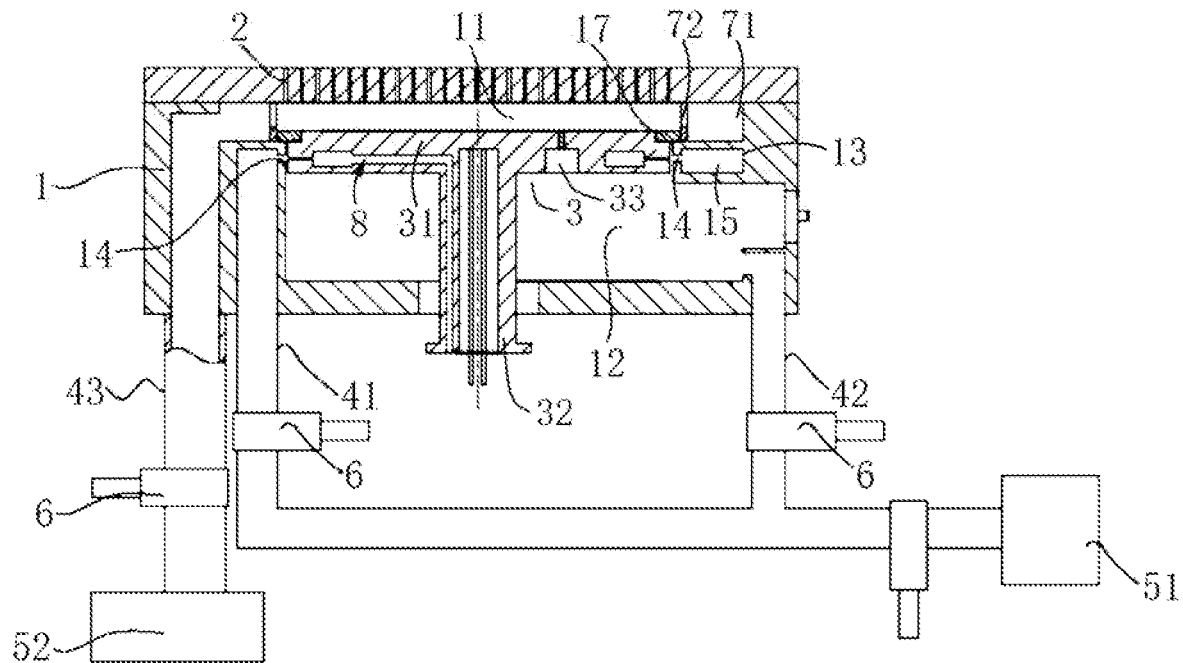
FIG. 1 is a schematic cross-sectional view of an exemplary semiconductor processing apparatus with a base in a process area according to some embodiments of the present disclosure.

The present disclosure is described in detail below, and embodiments of the present disclosure are shown in the drawings. Same or similar reference numerals denote same or similar components or components having the same or similar functions throughout. In addition, detailed descriptions of known technologies will be omitted if they are not necessary to illustrate features of the present disclosure. The embodiments described below with reference to the drawings are merely exemplary for explaining the present disclosure, and should not be construed as limiting the present disclosure.

Those skilled in the art should understand that, unless otherwise defined, all terms (including technical terms and scientific terms) used herein have the same meanings as commonly understood by those of ordinary skill in the art to which the present disclosure belongs. It should also be understood that terms, such as those defined in commonly used dictionaries, should be understood to have meanings consistent with their meaning in the context of the prior art, and unless specifically defined as herein, are not intended to have idealized or overly formal meanings.

The technical solution of the present disclosure and how the technical solution of the present disclosure solves the above technical problems will be described in detail below with specific embodiments.

Embodiment One

The present disclosure provides a semiconductor processing apparatus. FIG. 1 is a schematic cross-sectional view of an exemplary semiconductor processing apparatus with a base in a process area according to some embodiments of the present disclosure. As shown in FIG. 1, the apparatus includes a process chamber 1, a gas intake device 2, a base 3, and a flow guide structure 8. The process chamber 1 includes a process area 11 and a transfer area 12 arranged from top to bottom. The gas intake device 2 is disposed at a top of the process chamber 1 and is configured to pass a process gas into the process area 11. The base 3 is vertically movable and is disposed in the transfer area 12 for carrying a wafer (not shown). The flow guide structure 8 is connected to a gas supply source, and is fixedly attached to the base 3. When the base 3 is located at a process position (a position of the base 3 as shown in FIG. 1), the flow guide structure 8 is configured to blow a gas outward to an outer peripheral surface, such that a gas wall is formed between the outer peripheral surface of the base 3 and an inner peripheral surface of a sidewall of the process chamber 1 to prevent the process gas in the process area 11 from entering the transfer area 12. An exhaust structure 13 is disposed at the sidewall of the process chamber 1 and is configured to discharge the gas blown out of the flow guide structure 8 when the base 3 is located at the process position.

As shown in FIG. 1, the semiconductor processing apparatus may be used to perform an ALD process on the wafer. The wafer may be, for example, a silicon wafer. The present disclosure is not limited thereto. Specifically, the process chamber 1 may be a cylindrical structure made of metal material. The process chamber 1 includes the process area 11 and the transfer area 12 arranged from top to bottom. The gas intake device 2 may be disposed at the top of process chamber 1 to pass the process gas into the process area 11. The base 3 may be located in the transfer area 12. A top surface to the base 3 is configured to carry the wafer.

In some embodiments, the gas supply source may be, for example, an inert gas supply source. However, the present disclosure is not limited thereto.

In some embodiments, the position of the exhaust structure 13 should satisfy the following conditions. When the base 3 ascends to the process position in the process area, the flow guide structure 8 may be roughly aligned with the exhaust structure 13, such that the gas blown out of the flow guide structure 8 can be discharged. Specifically, the exhaust structure 13 may be located at the top of the transfer area 12.

Figure 2:
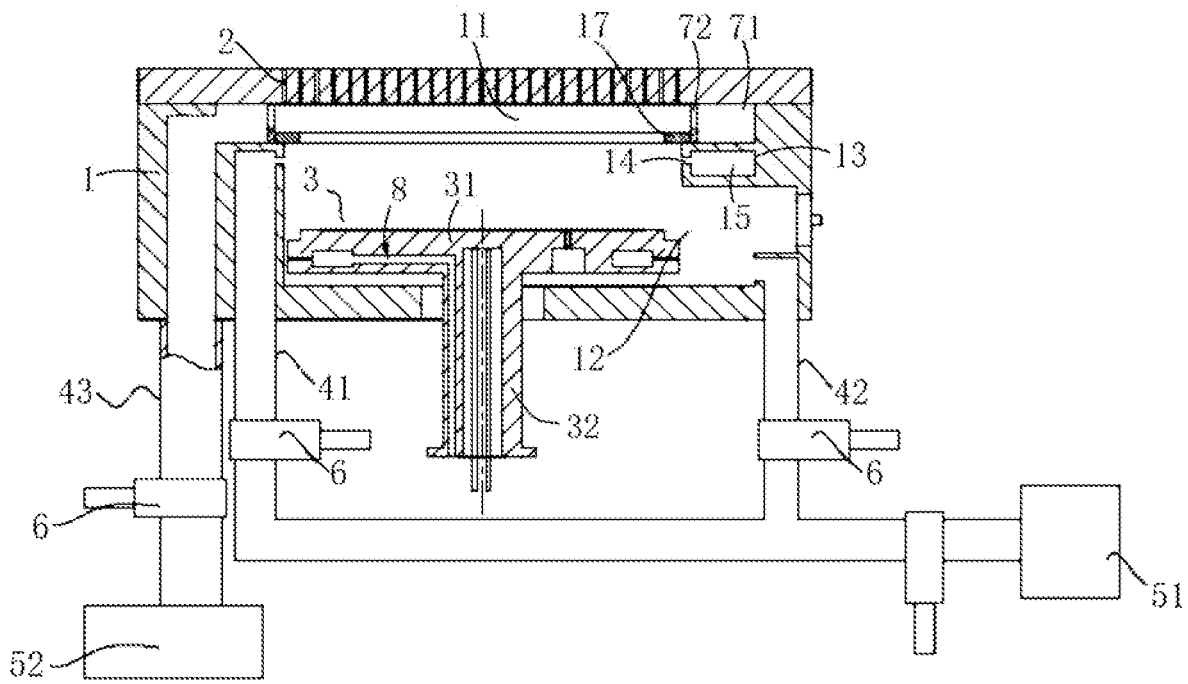
FIG. 2 is a schematic cross-sectional view of an exemplary semiconductor processing apparatus with the base in a transfer area according to some embodiments of the present disclosure.

When wafer transfer is required, as shown in FIG. 2, the base 3 is located at a transfer position in the transfer area 12 (the position of the base 3 in FIG. 2). At this time, a robot arm of the semiconductor processing apparatus (not shown) may enter the process chamber and transfer the wafer onto the base 3. Then the base 3 may be raised from the transfer position to the process position shown in FIG. 1. Referring to FIG. 1, the base 3 may carry the wafer into the process area 11. That is, a top surface (i.e., an upper surface) of the base 3 is located in the process area 11 such that an ALD process can be performed on the wafer in the process area 11 of the process chamber 1. When the wafer is processed in the process area, the flow guide structure 8 blows the gas outward to the outer peripheral surface of the base 3 to form the gas wall between the outer peripheral surface of the base 3 and the inner peripheral surface of the sidewall of the process chamber 1 to completely isolate the process area 11 and the transfer area 12 from each other. At the same time, the exhaust structure 13 may discharge the gas blown out from the flow guide structure 8, such that the process gas can be discharged with the air flow. Thus, the process gas in the process area 11 is prevented from entering the transfer area 12.

By using the flow guide structure 8 and the exhaust structure 13, the semiconductor processing apparatus provided by the present disclosure can prevent the transfer area 12 from being polluted by particles formed by the process gas, thereby substantially shortening a process chamber purging time and improving production capacity of the semiconductor processing apparatus. Moreover, by using the gas wall to prevent the process gas from entering the transfer area 12, no sealing part needs to be installed, and no other pollution may occur due to persistent operation. Issues such as wear-out, damage, and inapplicability to high temperature conditions for the sealing part no longer exist. The gas wall has wide applicability and scope of application, and may also save maintenance time due to damage to the sealing part. Thus, maintenance cost is reduced and equipment productivity is increased.

It should be noted that the embodiment of the present application does not limit what process the process chamber 1 specifically performs. For example, the process chamber 1 may also be used to perform physical vapor deposition or chemical vapor deposition processes. Therefore, the embodiments of the present disclosure are not limited thereto, and those skilled in the art can adjust the configuration by themselves according to actual requirements.

Figure 3:
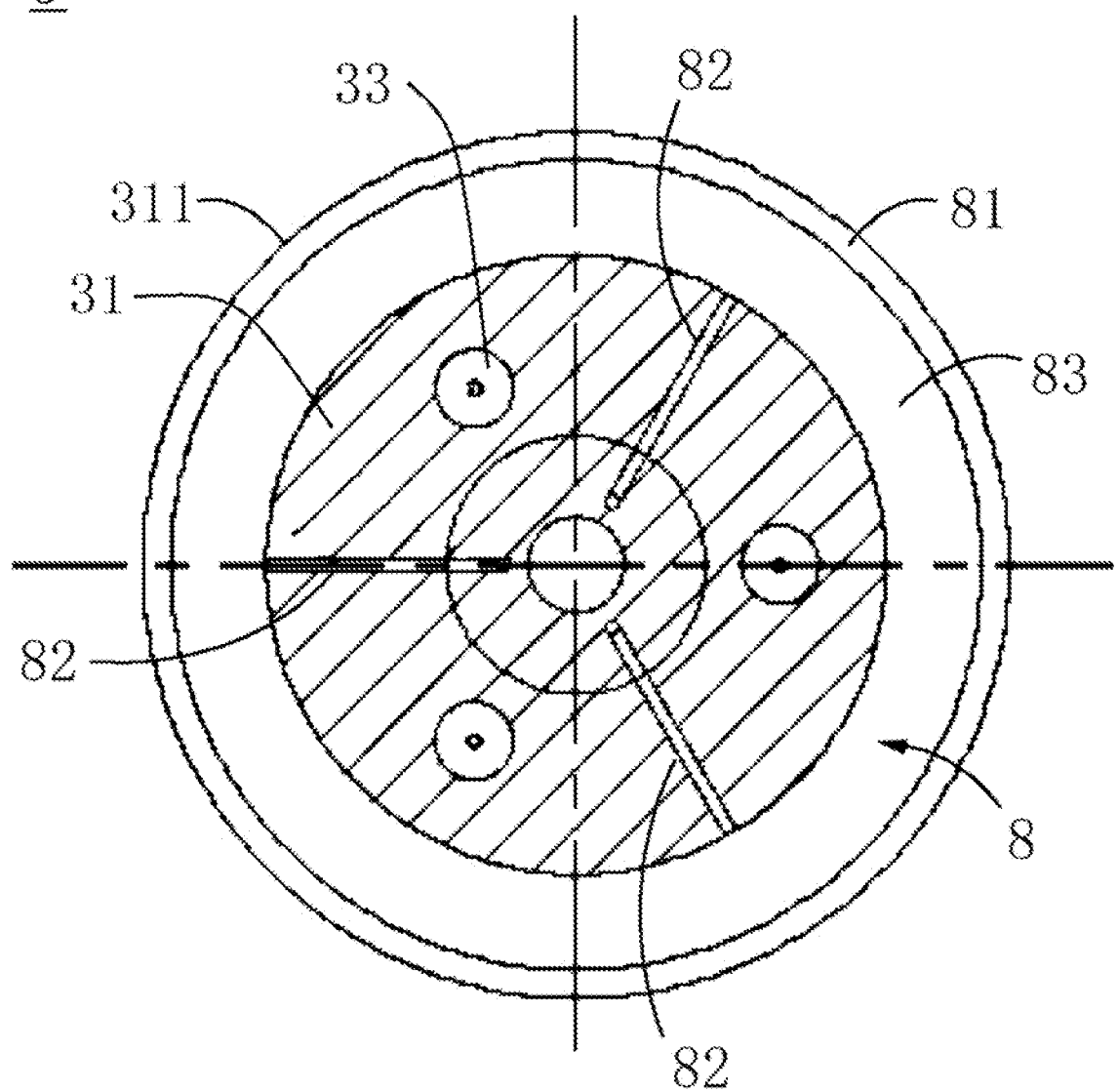
FIG. 3 is a schematic cross-sectional view of the base in a horizontal direction according to some embodiments of the present disclosure.
Figure 4:
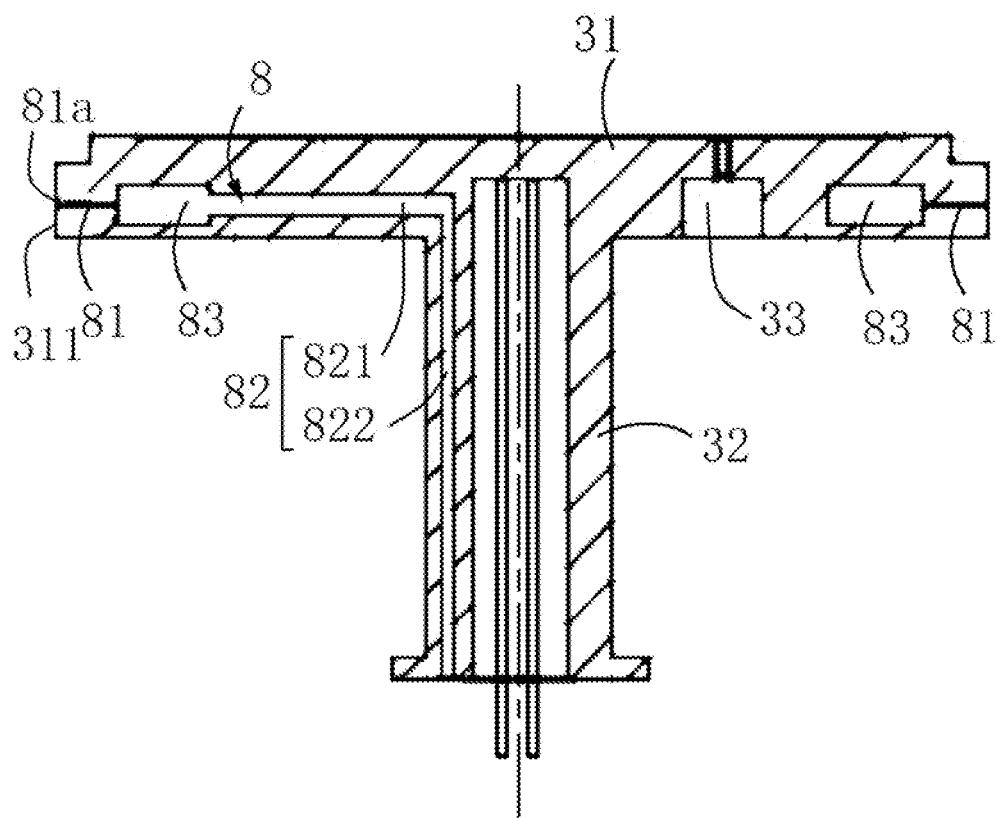
FIG. 4 is a schematic cross-sectional view of the base in a vertical direction according to some embodiments of the present disclosure.

In some embodiments, as shown in FIG. 3 and FIG. 4, the flow guide structure 8 includes a flow guide slot 81 and a flow channel 82 arranged in the base 3. The flow guide slot 81 is annular-shaped, and extends along a circumferential direction of the base 3. That is, the flow guide slot 81 is arranged around an axis of the base 3. The flow guide slot 81 includes an opening 81a disposed on the outer peripheral surface 311 of the base 3. Two ends of the flow channel 82 are connected to the flow guide slot 81 and the gas source supply, respectively. The flow channel 82 is used to pass the gas from the gas source supply to the flow guide slot 81.

In some embodiments, as shown in FIG. 3 and FIG. 4, the flow guide slot 81 may be arranged horizontally, such that the gas in the flow guide slot 81 can be blown out along a horizontal direction.

In some embodiments, as shown in FIG. 3 and FIG. 4, the flow guide structure 8 further includes a pressurization chamber 83 disposed in the base 3. The pressurization chamber 83 is annular-shaped, and the pressurization chamber 83 is arranged around the axis of the base 3. The pressurization chamber 83 is connected between a gas outlet of the flow channel 82 and the flow guide slot 81 for increasing a pressure of the gas discharged from the pressurization chamber 83.

Because a height of the pressurization chamber 83 in an axial direction of the base 3 is substantially greater than a height of the flow guide slot 81 in the axial direction of the base 3, when the gas enters the flow guide slot 81 through the pressurization chamber 83, a gas pressure in the flow guide slot 81 is high, which increases a gas flow rate. The increase of the gas flow rate helps the process gas to be discharged through the exhaust structure 13 with the gas flow, thereby further improving an isolation effect between the process area 11 and the transfer area 12. At the same time, after the gas enters the pressurized chamber 83 from the flow channel 82, the gas in the pressurized chamber 83 may diffuse along the circumferential direction, such that uniformity of gas distribution in the circumferential direction is improved, and the gas can be evenly blown out through the flow guide slot 81. Thus, a uniform air wall can be formed around the base 3 to ensure that the isolation effect of the gas wall in the circumferential direction is consistent.

Of course, in practical applications, the flow guide slot 81 may also be directly connected to the flow channel 82 according to actual needs.

In some embodiments, as shown in FIG. 1 to FIG. 4, the base 3 includes a base body 31 and a support shaft 32. The base body 31 is used to carry the wafer. An outer peripheral surface of the base body 31 is the outer peripheral surface 311 of the base 3. One end of the support shaft 32 is connected to the base body 31, and the other end passes through a bottom wall of the process chamber 1 and is connected with a driving source (not shown). Driven by the driving source, the support shaft 32 is used to drive the base body 31 to ascend or descend. As shown in FIG. 4, the flow channel 82 includes a horizontal section 821 disposed in the base body 31 and a vertical section 822 that extends vertically downward to sequentially pass through the base body 31 and the support shaft 32. An outlet end of the horizontal section 821 is connected to the pressurization chamber 83, and an inlet end of the vertical section 822 is connected to the gas source supply. By configuring the horizontal section 821 and vertical section 822, a gas path may be led out from the support shaft 32 located in the middle of the base body 31 to the outside of the process chamber 1, thereby facilitating a connection to the gas supply source. This way of leading out the gas path not only allows the gas path to be arranged inside the base 3, which reduces an occupied space of the flow guide structure, but also uses a sealing structure between the support shaft 32 and the bottom wall of the process chamber 1 to seal the gas path. Thus, a separate sealing structure is no longer needed to be designed for the flow guide structure, which simplifies the equipment structure and reduces the design complexity and cost.

As shown in FIG. 1 to FIG. 4, the base body 31 may be a disk-shaped structure made of metal material. The upper surface of the base body 31 is used to carry the wafer. Specifically, the support shaft 32 may be made of a same material as the base body 31. The support shaft 32 and the base body 31 may be integrally formed or may be separately formed. The present disclosure is not limited thereto. A top end of the support shaft 32 is located in the middle of a bottom surface of the base body 31, and a bottom end of the support shaft 32 passes through the bottom wall of the process chamber 1 and is connected to the driving source (not shown). Through the support shaft 32, the driving source is used to drive the base body 31 to ascend to the process position or to descend to the transfer position. Specifically, the driving source may be a telescopic screw drive mechanism or a telescopic cylinder mechanism. The present disclosure is not limited thereto.

In some embodiments, the flow channel 82 includes a plurality of flow channels 82. The horizontal sections 821 of the plurality of flow channels 82 are uniformly arranged along the circumferential direction of the base body 31, and the horizontal section 821 of each of the plurality of flow channels 82 extends along a radial direction of the base body 31. The vertical sections 822 of the plurality of flow channels 82 are uniformly arranged around the axis of the support shaft 32. For example, as shown in FIG. 3 and FIG. 4, three flow channels 82 are be provided, but the present disclosure is not limited to this number of the flow channels 82. For example, the number of flow channels 82 may be more than three. Therefore, the present disclosure is not limited thereto, and those skilled in the art can adjust the setting by themselves according to the actual situations. With the above-described design, because the plurality of flow channels 82 are uniformly arranged in the circumferential direction of the base body 31, the gas may flow into the flow guide slot 81 more uniformly, such that the gas blown out through the flow guide slot 81 is more uniform, and the isolation effect of the gas wall is further improved.

In some embodiments, the base body 31 may include two discs stacked vertically, and a ring-shaped groove is correspondingly provided at a peripheral position on each of two surfaces of the two discs facing toward each other. In addition, a plurality of grooves are correspondingly disposed on the two surfaces. After the two discs are stacked, the ring-shaped grooves on the two surfaces may be connected to form the flow guide slot 81. Each of the plurality of grooves on the two surfaces is connected to the horizontal section 821 of each of the plurality of flow channels 82. The above-described design may not only reduce the processing complexity of the plurality of flow channels 82, but also substantially reduce operation and maintenance costs.

It should be noted that the present disclosure does not limit the specific implementation of the base 3 and the flow guide structure 8. For example, the base body 31 and the flow guide slot 81 may be an integral structure and the flow guide slot 81 may be processed or curved on the base body 31. Therefore, the present disclosure is not limited thereto, and those skilled in the art can adjust the setting by themselves according to the actual situations.

It should also be noted that the base 3 may be equipped with a lifting assembly (such as a thimble device for wafer transfer). As shown in FIG. 3 and FIG. 4, a through-hole 33 is configured in the base body 31 for the thimble device to pass through. In this case, the horizontal sections 821 of the plurality of flow channels 82 should avoid the through-hole 33 to prevent mechanical interference between positions of the plurality of flow channels 82 and the thimble device, thereby reducing a failure rate and extending a service life.

Figure 5:
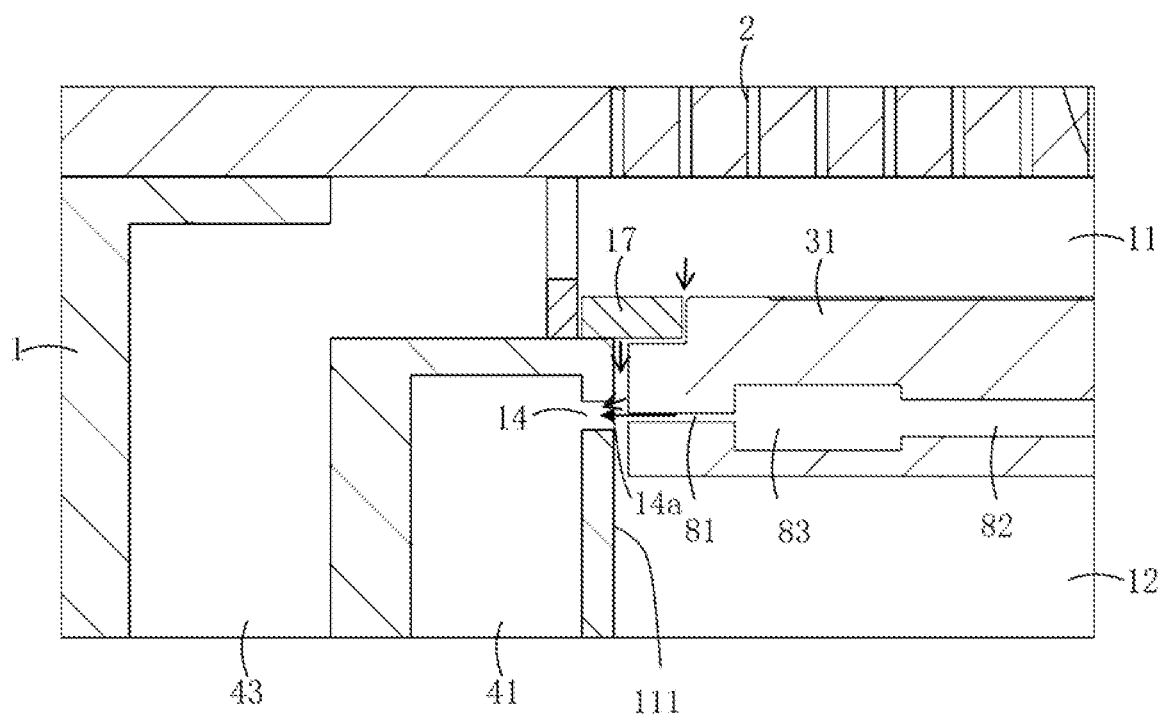
FIG. 5 is a partial cross-sectional view of an exemplary semiconductor processing apparatus according to some embodiments of the present disclosure.

In some embodiments, as shown in FIG. 1 and FIG. 5, the exhaust structure 13 includes an exhaust port 14, an exhaust cavity 15, and a first exhaust channel 41 that are disposed in the sidewall of the process chamber 1. The exhaust port 14 is annular-shaped, and extends along the circumferential direction of the sidewall of the process chamber 1. An inlet end 14a of the exhaust port 14 is located on the inner peripheral surface 111 of the sidewall of the process chamber 1. When the base 3 is located at the process position, the inlet end 14a is opposite to the opening 81a of the flow guide slot 81, such that the gas flowing out from the opening 81a of the flow guide slot 81 can enter the exhaust port 14 from the inlet end 14a of the exhaust port 14 on the opposite side. The exhaust cavity 15 is annular-shaped and extends along the circumferential direction of the sidewall of the process chamber 1. The exhaust cavity 15 is connected to an outlet end of the exhaust port 14 and an inlet end of the first exhaust channel 41 respectively. An outlet end of the first exhaust channel 41 is connected to a first gas extraction device 51. The first gas extraction device 51 is used to extract the gas in the exhaust cavity 15 through the first exhaust channel 41.

In some embodiments, a height of the inlet end 14a of the exhaust port 14 in the axial direction is greater than a height of the opening 81a of the flow guide slot 81 in the axial direction, such that the gas can enter the exhaust port 14 more easily and quickly, and can be guided into the exhaust cavity 15 by the exhaust port 14, such that an exhaust rate of the gas can be increased to reduce occurrence of gas turbulence.

In some embodiments, the exhaust cavity 15 may be, for example, a cavity with a rectangular cross-section in the axial direction.

In some embodiments, the first exhaust channel 41 may be formed in the sidewall of the process chamber 1, and the outlet end of the first exhaust channel 41 is connected to the first gas extraction device 51 through an external pipeline. Alternatively, the first exhaust channel 41 may also be formed in the external pipeline, and at least a part of the external pipeline is disposed in the sidewall of the process chamber 1, and the other part extends to the outside of the process chamber 1 and is connected to the first gas extraction device 51. In some other embodiments, the external pipeline is, for example, a metal pipeline or a pipeline made of other corrosion-resistant materials.

By using the first exhaust channel 41 in conjunction with the exhaust cavity 15, the gas discharged from the exhaust port 14 may be drawn out of the process chamber 1. At the same time, the exhaust flow rate can be increased by means of the exhaust cavity 15 to ensure that the gas can be discharged smoothly without being retained in the exhaust port 14. Thus, an exhaust efficiency can be improved and the occurrence of gas turbulence can be reduced. In addition, by arranging the exhaust port 14, the exhaust cavity 15 and the first exhaust channel 41 in the sidewall of the process chamber 1, the exhaust structure is simplified and occupies less space.

In some embodiments, the exhaust port 14, the exhaust cavity 15, and the first exhaust channel 41 are all arranged in the sidewall of the process chamber 1. However, the present disclosure is not limited thereto. In practical applications, the exhaust port 14, the exhaust cavity 15, and the first exhaust channel 41 may also be provided as separate components, as long as the gas blown out by the flow guide structure can be discharged.

In some embodiments, as shown in FIG. 1 and FIG. 2, the semiconductor processing apparatus further includes a second exhaust channel 42 disposed on the sidewall or the bottom wall of the process chamber 1. Two ends of the second exhaust channel 42 are connected to the transfer area 12 and the first gas extraction device 51, respectively, to discharge the gas in the transfer area 12.

Similar to the first exhaust channel 41, as shown in FIG. 1 and FIG. 2, the second exhaust channel 42 may be formed in the sidewall or the bottom wall of the process chamber 1, and an outlet end of the second exhaust channel 42 is connected to the first gas extraction device 51 through another external pipeline. Alternatively, the second exhaust channel 42 may also be formed in the other external pipeline, and at least a part of the other external pipeline is disposed in the sidewall or the bottom wall of the process chamber 1, and the other part extends to the outside of the process chamber 1 and is connected to the first gas extraction device 51. In some other embodiments, the other external pipeline is, for example, a metal pipeline or a pipeline made of other corrosion-resistant materials.

By using the second exhaust channel 42, when the base 3 is located at the transfer position (as shown in FIG. 2) in the transfer area 12, all the gases in the process chamber 1 may be discharged through the second exhaust channel 42. Thus, particles in the transfer area 12 can be prevented from entering the process area 11 to pollute the wafer, thereby substantially improving the process yield of the wafer.

It should be noted that the present disclosure does not limit the implementation manners of the first exhaust channel 41 and the second exhaust channel 42, as long as the exhaust function can be achieved. In addition, the first exhaust channel 41 and the second exhaust channel 42 may also connected to different gas extraction devices. Therefore, the present disclosure is not limited thereto, and those skilled in the art can adjust the setting by themselves according to the actual situations.

In some embodiments, as shown in FIG. 1 and FIG. 2, the semiconductor processing apparatus further includes a process exhaust structure. The process exhaust structure is connected to the process area 11 and is used to discharge the process gas in the process area 11. In some other embodiments, the process exhaust structure includes an exhaust slot 71, an exhaust grid 72, and a third exhaust channel 43 disposed in the sidewall of the process chamber 1. The exhaust slot 71 is annular-shaped, and extends along the circumference of the sidewall of the process chamber 1 (i.e., being configured around the axis of the process chamber 1). An opening of the exhaust slot 71 is located on the inner peripheral surface of the sidewall of the process chamber 1. The exhaust grid 72 is ring-shaped, and surrounds the opening of the exhaust slot 71. An inlet end of the third exhaust channel 43 is connected to the exhaust slot 71, and an outlet end of the third exhaust channel 43 is connected to a second gas extraction device 52. The second gas extraction device 52 is used to extract the process gas in the process area 11 through the third exhaust channel 43.

In some embodiments, as shown in FIG. 1 and FIG. 2, the exhaust slot 71 may be, for example, a cavity with a rectangular cross-section in the axial direction.

In some embodiments, a height of the exhaust grid 72 in its axial direction is the same as a height of the opening of the exhaust slot 71 in its axial direction, such that the exhaust grid 72 can completely cover the opening of the exhaust slot 71.

In some embodiments, the third exhaust channel 43 may be formed in the sidewall of the process chamber 1, and the outlet end of the third exhaust channel 43 may be connected to the second gas extraction device 52 through an external pipeline. Alternatively, the third exhaust channel 43 may also be formed in the external pipeline. At least a part of the external pipeline is disposed in the sidewall of the process chamber 1, and the other part extends to the outside of the process chamber 1 and is connected to the second gas extraction device 52. In some other embodiments, a part of the external pipeline, for example, may be formed in the sidewall of the process chamber 1, and the other part is a pipeline made of metal or other corrosion-resistant materials.

When performing the process, the process gas in the process area 11 may be directly extracted by using the process exhaust structure, which can further prevent the process gas in the process area 11 from diffusing into the transfer area 12. However, the present disclosure does not limit the specific implementation of the process exhaust structure, and those skilled in the art may adjust the setting according to the actual situations.

In some embodiments, as shown in FIG. 1 and FIG. 2, a valve 6 is provided on the first exhaust channel 41 and the second exhaust channel 42 respectively. The valve 6 is used to open or close the first exhaust channel 41 and the second exhaust channel 42. The third exhaust channel 43 is provided with a valve 6, and the valve 6 is used to open or close the third exhaust channel 43. Specifically, the valve 6 may be a solenoid valve, and may be connected to a controller of the semiconductor processing apparatus. The controller may control the on-off of each exhaust channel through the valve 6 according to actual needs. In some embodiments, when the valve 6 on the third exhaust channel 43 is opened, it means that the process chamber 1 is in a process state at this time. Thus, based on the state of the third exhaust channel 43, the controller controls the valves 6 of the first exhaust channel 41 and the second exhaust channel 42 to open to form the gas wall between the base 3 and the inner surface of the process chamber 1. When the valve 6 on the third exhaust channel 43 is closed, it means that the process chamber 1 is in a transfer state at this time. Thus, based on the state of the third exhaust channel 43, the controller controls the valve of the first exhaust channel 41 to close and controls the valve of the second exhaust channel 42 to open, such that all the gases in the process chamber 1 are discharged through the second exhaust channel 42, thereby preventing the particles in the transfer area 12 from entering the process area, and further preventing contamination of the wafer. By adopting the above design, not only a yield rate of the wafer can be improved, but also a level of automatic control can be significantly improved.

In some embodiments, as shown in FIG. 1 and FIG. 5, a partition plate 17 is also provided in the process chamber 1. The partition plate 17 is ring-shaped, and extends along the circumferential direction of the sidewall of the process chamber 1. An outer periphery of the partition plate 17 is connected to the inner peripheral surface of the process chamber 1 for separating the process chamber 1 into the process area 11 and the transfer area 12. When the base 3 is located at the process position, an upper surface of the partition plate 17 is coplanar with an upper surface of the base 3. Specifically, when the base 3 is located at the process position, a part of the base 3 is located at an inner side of the partition plate 17, and the upper surface of the partition plate 17 is flush with the upper surface of the base 3. The partition plate 17 can be used in conjunction with the gas wall to further prevent the process gas in the process area 11 from diffusing to the transfer area 12.

Specifically, the partition plate 17 is an annular plate made of metal, and the outer periphery of the partition plate 17 is connected to the inner wall of the process chamber 1 by welding. However, the present disclosure does not limit the specific connection method.

In some embodiments, the base body 31 includes a body portion and a protrusion portion located above the body portion, and an outer diameter of the protrusion portion is smaller than an outer diameter of the body portion. The protrusion portion is located at the inner side of the partition plate 17. The body portion is located below the partition plate 17. The outer peripheral surface of the body portion is the outer peripheral surface 311 of the base 3 (as shown in FIG. 4). In addition, the upper surface of the protrusion portion is flush with the upper surface of the partition plate 17.

In some embodiments, the outer peripheral surface of the protrusion portion of the base body 31 and the inner peripheral surface of the partition plate 17 are separated by a gap. The upper surface of the body portion of the base body 31 and a lower surface of the partition plate 17 may be in contact with each other or may be separated by the gap. With the above design, mechanical interference between the base 3 and the partition plate 17 can be avoided, thereby reducing the failure rate of the embodiments of the present disclosure.

In practical applications, the process gas is blown from the gas intake device 2 to enter the process area 11, and the process is performed on the wafer on the base 3. Then, the process gas is discharged through the third exhaust channel 43. In the process of performing the process, a small amount of the process gas may attempt to diffuse to the transfer area 12 along the gap between the partition plate 17 and the base 3. At this time, the gas wall formed by the gas blown out by the flow guide slot 81 may prevent the process gas from diffusing into the transfer area 12. The gas wall can drive the process gas to enter the first exhaust channel 41 through the exhaust port 14 and then can be discharged to prevent the process gas from diffusing to the transfer area 12, thereby facilitating complete isolation between the process area 11 and the transfer area 12. Specifically, a flow path of the process gas can be referred to as shown in FIG. 5.

Embodiment Two

Figure 6:
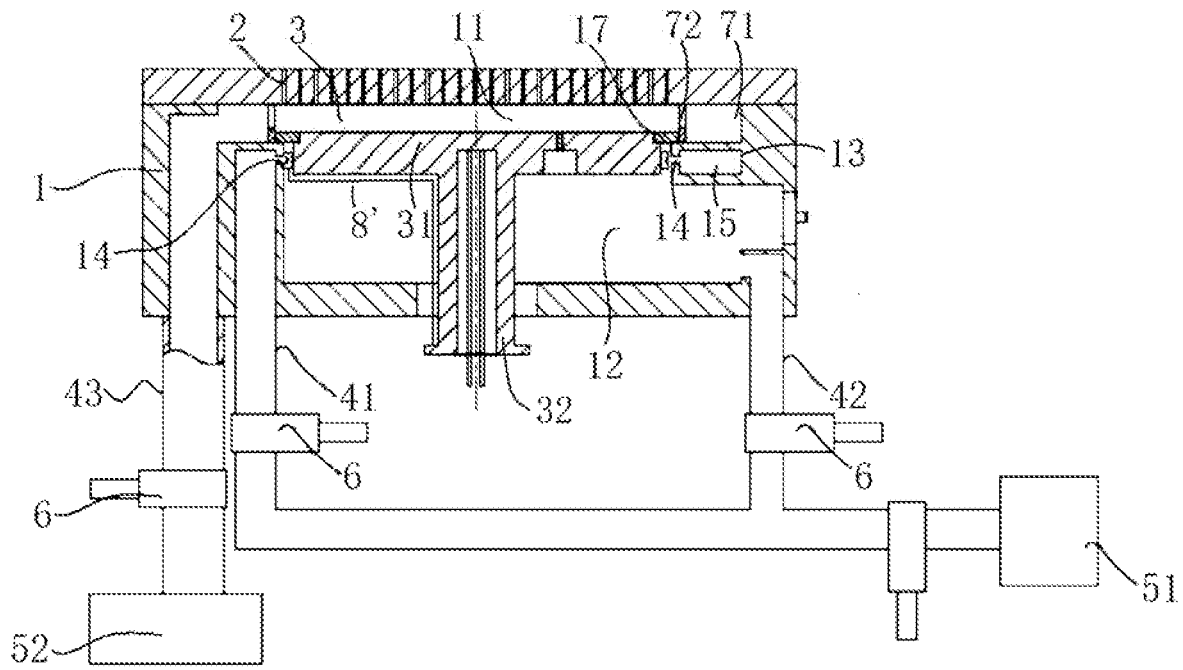
FIG. 6 is a schematic cross-sectional view of another exemplary semiconductor processing apparatus with the base in the process area according to some embodiments of the present disclosure.
Figure 7:
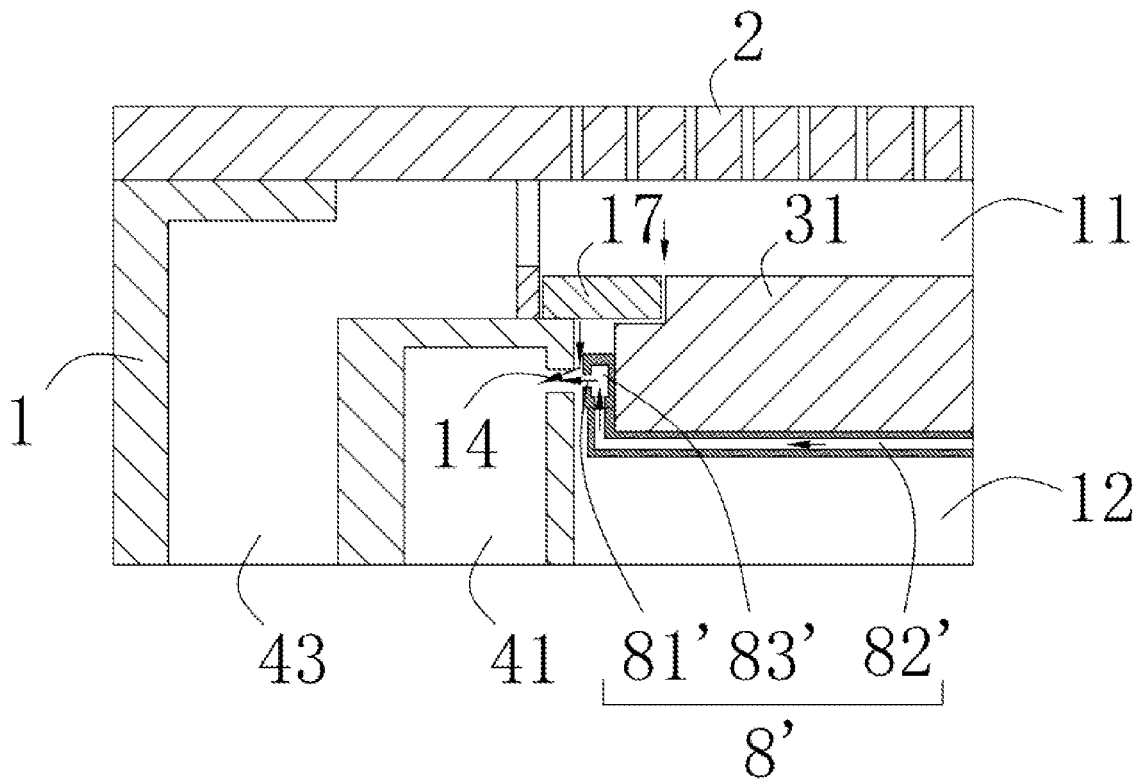
FIG. 7 is a partial cross-sectional view of another exemplary semiconductor processing apparatus according to some embodiments of the present disclosure.

Referring to FIG. 6 and FIG. 7, the present disclosure provides a semiconductor processing apparatus. The semiconductor processing apparatus includes the process chamber 1, the gas intake device 2, the base 3, and the flow guide structure 8', and the only difference is that the flow guide structure 8' is arranged outside the base 3.

Specifically, the flow guide structure 8' is fixedly arranged with the base 3 to be able to move up and down synchronously with the base 3, and the flow guide structure 8' is connected to a gas supply source. When the base 3 is located at the process position (i.e., the position of the base 3 in FIG. 6), the flow guide structure 8' blows the gas the outside of the outer peripheral surface of the base 3 to form a gas wall between the outer peripheral surface of the base 3 and the inner peripheral surface of the sidewall of the process chamber 1. Thus, the process gas in the process area 11 is prevented from entering the transfer area 12.

In some embodiments, as shown in FIG. 7, the flow guide structure 8' includes a flow guide body, and a flow guide slot 81' and a flow channel 82' configured in the flow guide body. The flow guide slot 81' is ring-shaped, and is arranged on the outer peripheral surface of the base 3 along the circumferential direction of the base 3. An opening of the flow guide slot 81' is opposite to an inlet end of the exhaust port 14, such that the gas flowing out of the opening of the flow guide slot 81' can enter the exhaust port 14 from the intake end of the exhaust port 14 on the opposite side. Two ends of the flow channel 82' are connected to the flow guide slot 81' and the gas supply source, respectively, and are used to guide the gas into the flow guide slot 81'.

In some embodiments, as shown in FIG. 7, the flow guide structure 8' further includes a pressurization chamber 83' provided in the flow guide body. The pressurization chamber 83' is annular-shaped, and surrounds the axial of the base 3. The pressurization chamber 83' is connected to the outlet end of the flow channel 82' and the flow guide slot 81' respectively, and is used to increase the pressure of the gas discharged from the pressurization chamber 83'.

In practical applications, the flow guide slot 81 may also be directly connected to the flow channel 82 according to specific needs.

In some embodiments, as shown in FIG. 6, the base 3 includes the base body 31 and the support shaft 32. The base body 31 is used to carry the wafer, and the outer peripheral surface of the base body 31 is the outer peripheral surface 311 of the base. One end of the support shaft 32 is connected to the base body 31, and the other end passes through the bottom wall of the process chamber 1 and is connected to the driving source (not shown), for driving the base body 31 up and down. In this case, the flow channel 82' may include the horizontal section arranged at the bottom of the base body 31 and the vertical section extending vertically downward from the horizontal section along the axial direction of the support shaft 32. The outlet end of the horizontal section is connected to the pressurized chamber 83', and the inlet end of the vertical section is connected to the gas supply source. By configuring the horizontal section and the vertical section, the gas path may start from the support shaft 32 located in the middle of the base body 31 to the outside of the process chamber 1, for being connected to the gas supply source. This arrangement of the gas path may not only configure the flow guide body close to the base body 31 and the support shaft 32, which reduces the occupied space of the flow guide structure, but also use the sealing structure between the support shaft 32 and the bottom wall of the process chamber 1 to seal the gas path. Therefore, it is no longer necessary to design a separate sealing structure for the flow guide structure, which simplifies the structure of the apparatus and reduces the design complexity and cost.

In some embodiments, the flow guide body includes an annular part for forming the flow guide slot 81' and the pressurization chamber 83', and a pipeline part for forming the flow channel 82'. In this case, if there are multiple flow channels 82', then there are also multiple pipeline parts of the flow guide body to form a plurality of flow channels 82' in one-to-one correspondence. Of course, in practical applications, the plurality of pipeline parts of the flow guide body may also be of an integral structure.

Other structures and functions of the semiconductor processing apparatus provided in embodiment two are the same as those in embodiment one. Because they have been described in detail in embodiment one, the detailed description thereof will not be repeated herein.

The embodiments of the present disclosure provide at least the following beneficial effects. The semiconductor processing apparatus provided in the embodiments of the present disclosure utilizes the guide structure fixedly arranged with the base. When the base is located at the process position, the gas is blown to the outside of the outer peripheral surface of the base to form the gas wall between the outer peripheral surface of the base and the inner peripheral surface of the sidewall of the process chamber to achieve complete isolation between the process area and the transfer area. At the same time, the exhaust structure is used to discharge the gas blown out of the guide structure, such that the process gas can be discharged with the gas flow, such that the process gas in the process area is prevented from entering the transfer area, and the contamination of the transfer area by the particles formed by the process gas can be avoided. As such, the purging time of the process chamber can be substantially shortened and the productivity of the semiconductor processing apparatus can be improved. In addition, the embodiments of the present disclosure utilize the gas wall to prevent the process gas from entering the transfer area, eliminates the need to install sealing parts, and causes no other pollution due to long-term operation, so there are no problems such as loss and damage of sealing parts, and inapplicability to high temperature conditions.

Therefore, the gas wall has wide applicability and scope of application, and also saves maintenance time due to damage to the sealing parts, thereby reducing maintenance costs and increasing equipment productivity.

It should be understood that, the above embodiments are merely exemplary for illustrating the operation principle of the present disclosure, but the present disclosure is not limited thereto. For those skilled in the art, various modifications and improvements may be made without departing from the spirit of the present disclosure, and these modifications and improvements are also regarded as the protection scope of the present disclosure.

In the description of the present disclosure, it should be understood that the orientations and positional relationships indicated by the terms "center", "upper", "lower", "front", "rear", "left", "right", "vertical", "horizontal", "top", "bottom", "inner", "outer", etc. are based on the orientations or positional relationships shown in the drawings, and are merely for the convenience of describing the present disclosure and simplifying the description, rather than indicating or implying that the referenced devices or elements must have a particular orientation, or must be constructed and operated in a particular orientation. Thus, they should not be construed as limiting the present disclosure.

The terms "first" and "second" are used for descriptive purposes only, and should not be understood as indicating or implying relative importance or implicitly specifying the quantity of indicated technical features. Thus, a feature defined as "first" and "second" may explicitly or implicitly include one or more of these features. In the description of the present disclosure, unless otherwise specified, "plurality" means two or more.

In the description of the present disclosure, it should be noted that unless otherwise specified and limited, the terms "installation", "attaching", and "connection" should be understood in a broad sense. For example, it may be a fixed connection, a detachable connection, or an integrally connected connection. It may be directly connected, or indirectly connected through an intermediary. It may be the internal connection of two elements. Those of ordinary skill in the art should understand the specific meanings of the above terms in the present disclosure in specific situations.

In the description of the specification, specific features, structures, materials or characteristics may be combined in any one or more embodiments or examples in an appropriate manner.

The above descriptions are only some implementations of the present disclosure. It should be pointed out that for those of ordinary skill in the art, improvements and modifications can be made without departing from the spirit of the present disclosure. These improvements and modifications should be regarded as within the protection scope of the present disclosure.

What is claimed is:

1. A semiconductor processing apparatus, comprising:
 a process chamber;
 a gas intake device; and
 a carrier device, wherein:
  the process chamber includes a process area and a transfer area arranged below the process area, the gas intake device is disposed at a top of the process chamber for introducing a process gas into the process area;
  the process chamber further includes a partition plate for dividing the process area and the transfer area;
  the carrier device includes a base and a flow guide structure, the base is movable in a vertical direction and is disposed in the transfer area for carrying a to-be-processed workpiece;

the flow guide structure is arranged in the base and is connected to a gas supply source; and when the base is located at a process position, the flow guide structure is configured to blow a gas outward to a sidewall of the process chamber, such that a gas wall is formed between an outer peripheral surface of the base and an inner peripheral surface of the sidewall of the process chamber to prevent the process gas in the process area from entering the transfer area;

the flow guide structure includes a flow guide slot and a plurality of flow channels, the flow guide slot is arranged on an outer peripheral wall of the base and extends along a circumferential direction of the base, the plurality of flow channels are arranged in the base, two ends of a flow channel of the plurality of flow channels are connected to the flow guide slot and the gas supply source, respectively, and the plurality of flow channels are used to guide the gas from the gas supply source to the flow guide slot; and an exhaust structure is disposed at the sidewall of the process chamber and is opposite to the flow guide structure and configured to discharge the gas blown out of the flow guide structure when the base is located at the process position.

2. The semiconductor processing apparatus according to claim 1, wherein:

the base includes a base body and a support shaft, the base body is used to carry the to-be-processed workpiece, and one end of the support shaft is connected to the base body, and another end of the support shaft passes through a bottom wall of the process chamber to connect with a driving source.

3. The semiconductor processing apparatus according to claim 2, wherein:

the flow guide structure further includes an annular pressurization chamber formed in the base body and arranged around an axis of the base body, and the plurality of flow channels are communicated with the flow guide slot through the pressurization chamber.

4. The semiconductor processing apparatus according to claim 3, wherein:

a plurality of portions of the plurality of flow channels in the base body extend along a radial direction of the base body and are arranged uniformly along a circumferential direction of the base body; and a plurality of portions of the plurality of flow channels in the support shaft extend along an axial direction of the support shaft and are uniformly arranged around an axis of the support shaft.

5. The semiconductor processing apparatus according to claim 2, wherein:

the exhaust structure includes an exhaust cavity and a first exhaust channel, the exhaust cavity is annular-shaped and formed in the sidewall of the process chamber, and extends along a circumferential direction of the sidewall, an exhaust port extending along the circumferential direction of the sidewall and being communicated with the exhaust cavity is formed on the sidewall, and when the base is at the process position, the exhaust port is opposite to the flow guide slot; and a height of the exhaust port is greater than a height of the flow guide slot, an end of the first exhaust channel is communicated with the exhaust cavity, and another end of the first exhaust channel is communicated with a first gas extraction device.

6. The semiconductor processing apparatus according to claim 5, further comprising a second exhaust channel, two ends of the second exhaust channel being connected to the transfer area and the first gas extraction device respectively.

7. The semiconductor processing apparatus according to claim 6, wherein:

a process exhaust structure is arranged at an inner wall of the process area of the process chamber, and the process exhaust structure is configured to discharge the process gas in the process area.

8. The semiconductor processing apparatus according to claim 7, wherein:

the process exhaust structure includes an exhaust slot, an exhaust grid, and a third exhaust channel, the exhaust slot is annular-shaped, is disposed in the sidewall of the process chamber, and extends along the circumference of the sidewall;

the exhaust grid is ring-shaped and arranged at an opening of the exhaust slot; and an end of the third exhaust channel is communicated with the exhaust slot, and another end of the third exhaust channel is connected to a second gas extraction device.

9. The semiconductor processing apparatus according to claim 8, wherein:

the first exhaust channel and the second exhaust channel include a first valve and a second valve, respectively;

the first and second valves are configured to open or close the first exhaust channel and the second exhaust channel, respectively; and the third exhaust channel includes a third valve, and the third valve is configured to open or close the third exhaust channel.

10. The semiconductor processing apparatus according to claim 1, wherein:

the partition plate is ring-shaped, an outer periphery of the partition plate is connected to the inner peripheral surface of the sidewall of the process chamber, and when the base is located at the process position, an upper surface of the partition plate is coplanar with an upper surface of the base.

11. A semiconductor processing apparatus, comprising:

a process chamber;

a gas intake device; and a carrier device, wherein:

the process chamber includes a process area, a transfer area below the process area, and a partition plate dividing the process area and the transfer area, the gas intake device is disposed at a top of the process chamber for introducing a process gas into the process area;

the carrier device includes a base that is movable in a vertical direction and disposed in the transfer area for carrying a to-be-processed workpiece, a predetermined gap is arranged between a sidewall of the process chamber and the base, the sidewall includes a first opening connected to an exhaust structure, the predetermined gap connects the process area and the transfer area;

the base includes a flow guide structure that moves with the base, the flow guide structure has a second opening facing the sidewall and is connected to a gas supply source; and when the base is located at a process position, the second opening is opposite to the first opening, the flow guide structure is configured to blow a gas through the second opening to the predetermined gap and the first opening along a horizontal direction to prevent the process gas in the process area from entering the transfer area via the predetermined gap;

the flow guide structure further includes a flow guide slot connecting to the second opening and a plurality of flow channels, the flow guide slot extends along a circumferential direction of a base body, the plurality of flow channels are arranged in the base body and a support shaft, two ends of a flow channel of the plurality of flow channels are connected to the flow guide slot and the gas source supply, respectively, and the plurality of flow channels are used to guide the gas from the gas source supply to the flow guide slot; and the exhaust structure is configured to discharge the gas blown out of the flow guide structure when the base is located at the process position.

12. The semiconductor processing apparatus according to claim 11, wherein:

the base further includes the base body and the support shaft, the base body is used to carry the to-be-processed workpiece, and one end of the support shaft is connected to the base body, and another end of the support shaft passes through a bottom wall of the process chamber to connect with a driving source.

13. The semiconductor processing apparatus according to claim 12, wherein:

the flow guide structure further includes an annular pressurization chamber formed in the base body and arranged around an axis of the base body, and the plurality of flow channels are communicated with the flow guide slot through the pressurization chamber.

14. The semiconductor processing apparatus according to claim 13, wherein:

a plurality of portions of the plurality of flow channels in the base body extend along a radial direction of the base body and are arranged uniformly along a circumferential direction of the base body; and a plurality of portions of the plurality of flow channels in the support shaft extend along an axial direction of the support shaft and are uniformly arranged around an axis of the support shaft.

15. The semiconductor processing apparatus according to claim 12, wherein:

the exhaust structure includes an exhaust cavity and a first exhaust channel, the exhaust cavity is annular-shaped and formed in the sidewall, and extends along a circumferential direction of the sidewall, an exhaust port extending along the circumferential direction of the sidewall and being communicated with the exhaust cavity is formed on the sidewall, and when the base is at the process position, the exhaust port is opposite to the flow guide slot; and a height of the exhaust port is greater than a height of the flow guide slot, an end of the first exhaust channel is communicated with the exhaust cavity, and another end of the first exhaust channel is communicated with a first gas extraction device.

16. The semiconductor processing apparatus according to claim 15, further comprising a second exhaust channel, two ends of the second exhaust channel being connected to the transfer area and the first gas extraction device respectively.

17. The semiconductor processing apparatus according to claim 16, wherein:

a process exhaust structure is arranged at an inner wall of the process area of the process chamber, and the process exhaust structure is configured to discharge the process gas in the process area.

18. The semiconductor processing apparatus according to claim 17, wherein:

the process exhaust structure includes an exhaust slot, an exhaust grid, and a third exhaust channel, the exhaust slot is annular-shaped, is disposed in the sidewall of the process chamber, and extends along the circumference of the sidewall;

the exhaust grid is ring-shaped and arranged at a third opening of the exhaust slot; and an end of the third exhaust channel is communicated with the exhaust slot, and another end of the third exhaust channel is connected to a second gas extraction device.

19. The semiconductor processing apparatus according to claim 18, wherein:

the first exhaust channel includes a first valve configured to open or close the first exhaust channel;

the second exhaust channel includes a second valve configured to open or close the second exhaust channel; and the third exhaust channel includes a third valve configured to open or close the third exhaust channel.

20. The semiconductor processing apparatus according to claim 11, wherein:

the partition plate is ring-shaped, an outer periphery of the partition plate is connected to the sidewall, and when the base is located at the process position, an upper surface of the partition plate is coplanar with an upper surface of the base.

\* \* \* \* \*